United States Patent
Tabatabaie et al.

(10) Patent No.: US 8,853,745 B2
(45) Date of Patent: Oct. 7, 2014

(54) SILICON BASED OPTO-ELECTRIC CIRCUITS

(75) Inventors: Kamal Tabatabaie, Sharon, MA (US);
Jeffrey R. LaRoche, Lowell, MA (US);
Valery S. Kaper, Winchester, MA (US);
John P. Bettencourt, Danvers, MA (US); Kelly P. Ip, Lowell, MA (US)

(73) Assignee: Raytheon Company, Waltham, MA (US)

( * ) Notice: Subject to any disclaimer, the term of this patent is extended or adjusted under 35 U.S.C. 154(b) by 1028 days.

(21) Appl. No.: 12/356,252

(22) Filed: Jan. 20, 2009

(65) Prior Publication Data

US 2010/0181601 A1 Jul. 22, 2010

(51) Int. Cl.
| | |
|---|---|
| *H01L 29/66* | (2006.01) |
| *H01L 29/20* | (2006.01) |
| *H01S 5/183* | (2006.01) |
| *H01S 5/026* | (2006.01) |
| *H01L 27/06* | (2006.01) |
| *H01S 5/22* | (2006.01) |
| *H01S 5/022* | (2006.01) |
| *H01S 5/02* | (2006.01) |

(52) U.S. Cl.
CPC ............. *H01S 5/0261* (2013.01); *H01S 5/2214* (2013.01); *H01S 5/02248* (2013.01); *H01S 5/021* (2013.01); *H01S 5/183* (2013.01); *H01L 27/0617* (2013.01); *H01S 5/0262* (2013.01); *H01S 2301/173* (2013.01)
USPC ................... 257/213; 257/615; 257/E29.089; 257/E29.166

(58) Field of Classification Search
USPC ................... 257/213, 615, E29.068, E29.166
See application file for complete search history.

(56) References Cited

U.S. PATENT DOCUMENTS

| | | | |
|---|---|---|---|
| 4,774,205 A | 9/1988 | Choi et al. | |
| 4,982,256 A | 1/1991 | Suzuki | |
| 5,308,444 A | 5/1994 | Fitzgerald, Jr. et al. | |
| 5,361,273 A | 11/1994 | Kosaka | |
| 5,373,171 A | 12/1994 | Imai et al. | |
| 5,766,783 A | 6/1998 | Utsumi et al. | |
| 5,903,015 A | 5/1999 | Shiomi et al. | |
| 6,171,936 B1 | 1/2001 | Fitzgerald | |
| 6,246,708 B1 * | 6/2001 | Thornton et al. | ........ 372/50.124 |
| 6,703,144 B2 | 3/2004 | Fitzgerald | |

(Continued)

FOREIGN PATENT DOCUMENTS

| | | |
|---|---|---|
| JP | 05 259433 | 10/1993 |
| JP | 06 244502 | 9/1994 |

OTHER PUBLICATIONS

Ohata et al., Machine Translation of JP 05-259433 A, Oct. 8, 1993.*

(Continued)

*Primary Examiner* — Lynne Gurley
*Assistant Examiner* — Vernon P Webb
(74) *Attorney, Agent, or Firm* — Daly, Crowley, Mofford & Durkee, LLP

(57) ABSTRACT

A semiconductor structure, comprising: a substrate; a seed layer over an upper surface of the substrate; a semiconductor layer disposed over the seed layer; a transistor device in the semiconductor layer; wherein the substrate has an aperture therein, such aperture extending from a bottom surface of the substrate and terminating on a bottom surface of the seed layer; and an opto-electric structure disposed on the bottom surface of the seed layer.

8 Claims, 14 Drawing Sheets

(56) References Cited

U.S. PATENT DOCUMENTS

| | | | |
|---|---|---|---|
| 6,713,326 | B2 | 3/2004 | Cheng et al. |
| 7,256,142 | B2 | 8/2007 | Fitzgerald |
| 7,301,180 | B2 | 11/2007 | Lee et al. |
| 7,332,417 | B2 | 2/2008 | Westhoff et al. |
| 7,390,701 | B2 | 6/2008 | Cheng et al. |
| 7,465,619 | B2 | 12/2008 | Fitzgerald |
| 2003/0022438 | A1 | 1/2003 | Callaway, Jr. et al. |
| 2005/0139838 | A1 | 6/2005 | Murata et al. |
| 2006/0011938 | A1* | 1/2006 | Debray et al. ............. 257/104 |
| 2006/0054926 | A1 | 3/2006 | Lahreche |
| 2006/0284247 | A1 | 12/2006 | Augustine et al. |
| 2007/0105335 | A1 | 5/2007 | Fitzgerald |
| 2008/0070355 | A1 | 3/2008 | Lochtefeld et al. |
| 2008/0149915 | A1 | 6/2008 | Mori et al. |

OTHER PUBLICATIONS

Notification of Transmittal of the International Search Report and the Written Opinion of the International Searching Authority, or the Declaration, PCT/US2010/021443 dated Apr. 14, 2010, 6 pages.
Written Opinion of the International Searching Authority, PCT/US2010/021443 dated Apr. 14, 2010, 7 pages.
"Chapter 12: Metallization" In: Quirk M, Serda J: "Semiconductor Manufacturing Technology", Jan. 1, 2001, Prentice-Hall, Inc., Upper Saddel River, NJ, US, XP002576021. ISBN: 0130815200, pp. 299-333.
Notification of Transmittal of the International Search Report and the Written Opinion of the International Searching Authority, or the Declaration, PCT/US2007/022325, date of mailing Apr. 10, 2008, 5 pages.
The Written Opinion of the International Searching Authority, PCT/US2007/022325, date of mailing Apr. 10, 2008, 7 pages.
Miskys et al., "AlN/diamond heterojunction diodes", Applied Physics Letters, AIP, 2003 American Institute of Physics, Melville, NY, US, vol. 82, No. 2, Jan. 13, 2003, pp. 290-292, XP012034092, ISSN: 0003-6951.
Polyakov et al., "Growth of AlBN Solid Solutions by Organometallic Vapor-Phase Epitaxy", Journal of Applied Physics, American Institute of Physics, vol. 81, No. 4, Feb. 15, 1997, pp. 1715-1719, XP012041570, ISSN: 0021-8979.
Vescan et al., "High-Temperature, High-Voltage Operation of Pulse-Doped Diamond MESFET", IEEE Electron Device Letters, vol. 18, No. 5, May 1997, pp. 222-224, XP011018247, ISSN: 0741-3106.
Edgar et al., "c-Boron-Aluminum Nitride Alloys Prepared by Ion-Beam Assisted Deposition", Thin Solid Films, Elsevier-Sequoia S.A. Lausanne, Ch, vol. 298, No. 1-2, Apr. 20, 1997, pp. 33-38, XP004125912, ISSN: 0040-6090.
U.S. Appl. No. 12/497,994, filed Jul. 6, 2009, 17 pages.
USPTO Office Action dated Jul. 19, 2010 for U.S. Appl. No. 12/497,994, 9 pages.
Response to the Office Action dated Jul. 19, 2010 for U.S. Appl. No. 12/497,994, 4 pages.
USPTO Office Action dated Dec. 29, 2010 for U.S. Appl. No. 12/497,994, 7 pages.
U.S. Appl. No. 12/497,994, filed Jul. 6, 2009.
Katherine Herrick, Thomas Kazior, Amy Liu, Dmitri I. Loubychev, Joel M. Fastenau, Miguel Urteaga, Eugene A. Fitzgerald, Mayank T. Bulsara, David Clark, Berinder Brar, Wonill Ha, Joshua Bergman, Nicolas Daval and Jeffery LaRoche, Direct Growth of III-V Devices on Silicon, Matter Res. Soc. Symp. Proc., vol. 1068, 2008, pp. 1-6.
Carl H. Dohrman, Kamesh Chilukuri, David M. Isaacson, Minjoo L. Lee, Eugene A. Fitzgerald, Fabrication of Silicon On Lattice-Engineered Substrate (SOLES) as a Platform for Monolithic Integration of CMOS and Optoelectronic Devices, Materials Science and Engineering B, 2006, pp. 235-237.
Jeffery LaRoche, Kelly IP, Kamal Alavi, John Bettencourt, Val Kaper, Heterogeneous Single, Multispectral, and Hyperspectral Focal Plane Arrays on III-V/Si Multi Layer Bonded Substrates.
Notification of Transmittal of the International Search Report and the Written Opinion of the International Searching Authority, or the Declaration, PCT/US2010/021444 dated Apr. 13, 2010, 6 pages.
Written Opinion of the International Searching Authority, PCT/US2010/021444 dated Apr. 13, 2010, 8 pages.
Notification Concerning Transmittal of International Preliminary Report on Patentability (Chapter 1 of the Patent Cooperation Treaty), PCT/US2010/021444 date of mailing Aug. 4, 2011, 2 pages.
Written Opinion of the International Searching Authority, PCT/US2010/021444 date of mailing Aug. 4, 2011, 7 pages.

* cited by examiner

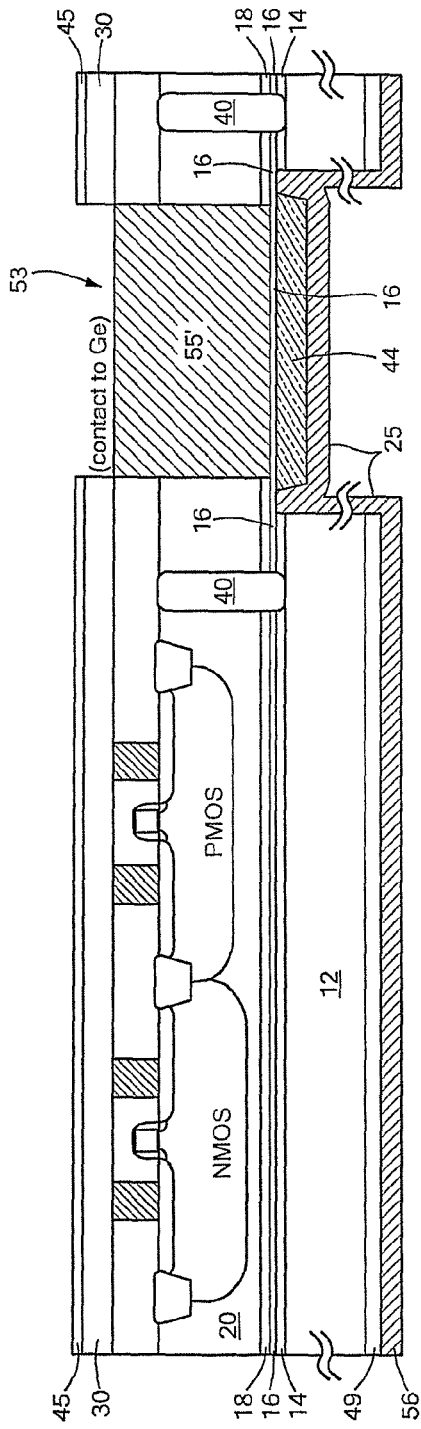
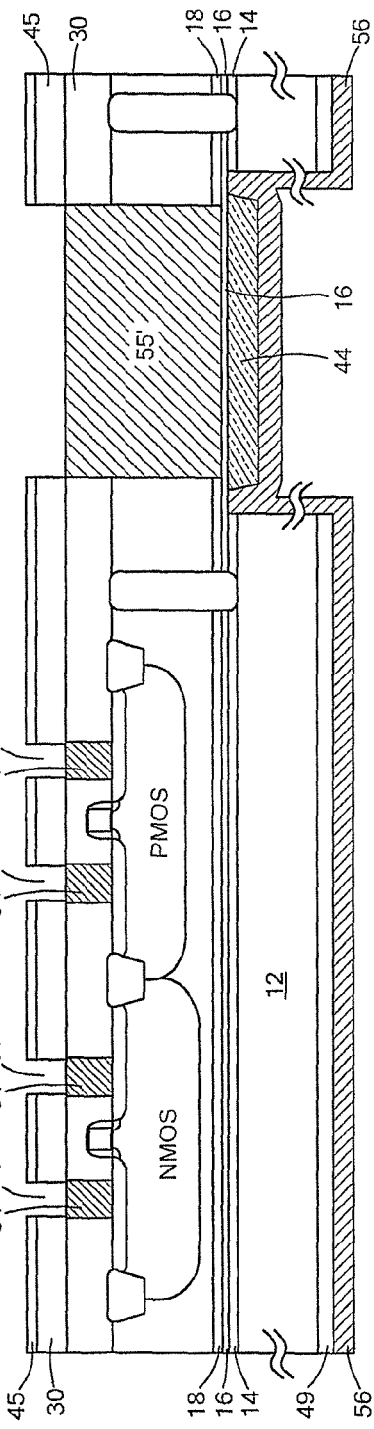
FIG. 3A
FIG. 3B

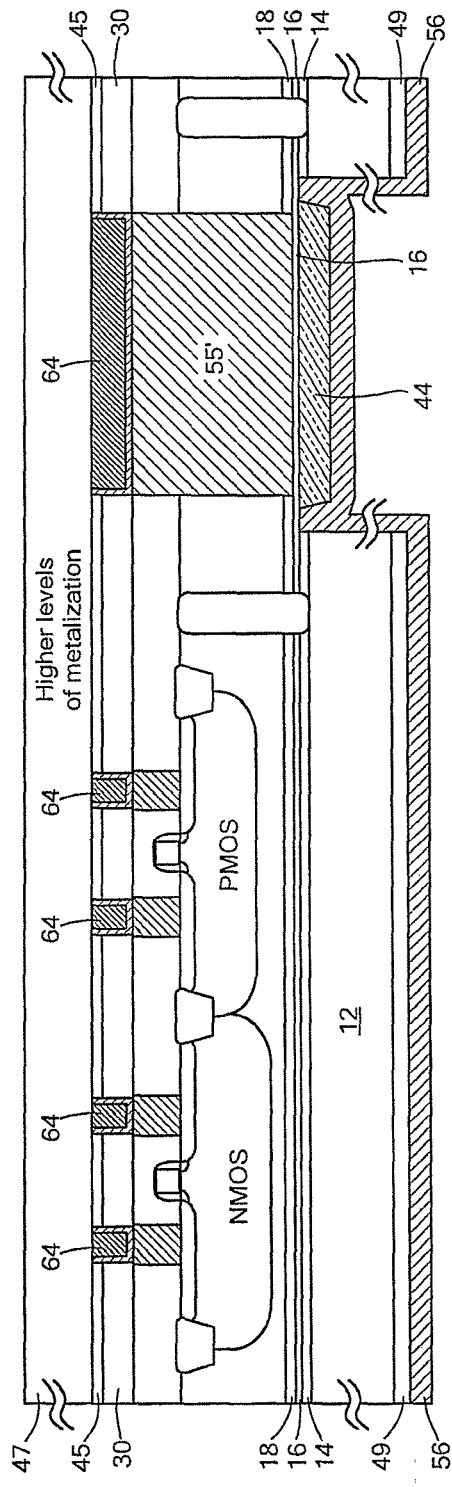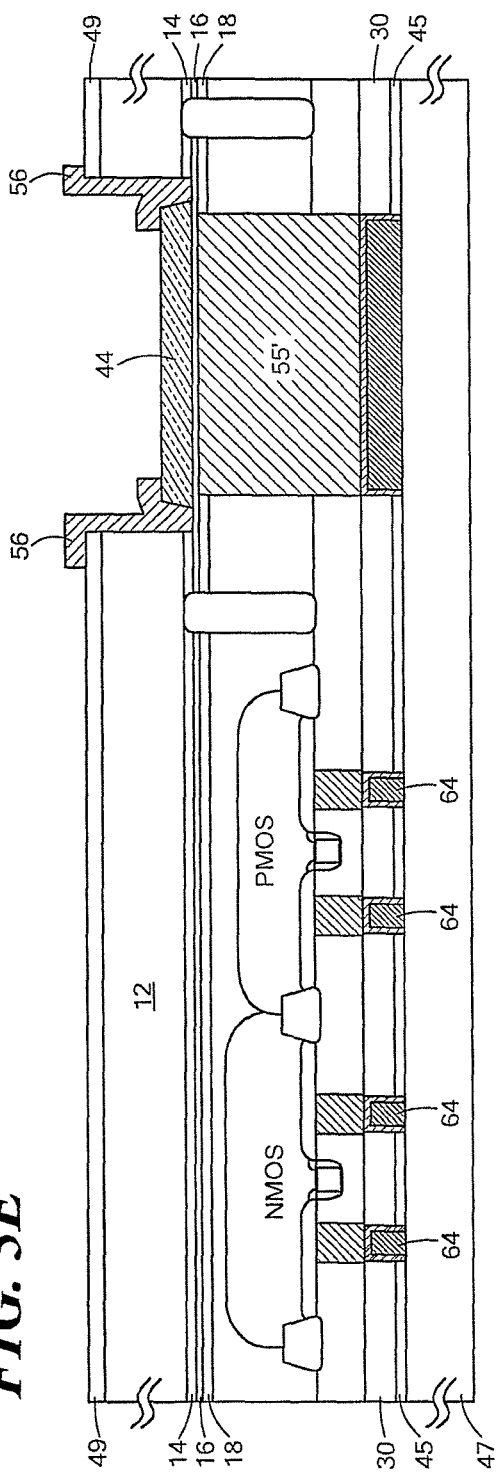
*FIG. 3E*
*FIG. 3F*

SILICON BASED OPTO-ELECTRIC CIRCUITS

CROSS-REFERENCE TO RELATED APPLICATIONS

This application relates to co-pending patent application U.S. patent application Ser. No. 12/356,254 filed on the same day as this patent application, the entire subject matter thereof being incorporated herein by reference.

TECHNICAL FIELD

This invention relates generally to silicon based opto-electric circuits.

BACKGROUND

As is known in the art, with the Si CMOS VLSI integration capability passing the one-billion transistors level, the communication of electrical signals within various parts of a chip, between separate chips, and between printed circuit boards creates severe challenges with regard to speed and power consumption. Use of photonics instead of electronics has been sought as the best solution to this problem. Progress has been made in integrating passive optical components in Si technology, as reported in US patents in references such as, for example, U.S. Pat. Nos. 7,374,106; 7,286,726; 7,057,256; 6,930,82; 5,767,539, 6,154,475, 7,321,713, and 7,057,256.

As is also known in the art, vertical cavity surface emitting laser (VCSEL) and PIN photo-diodes with the well-established optical fibers have been proposed as indicated in this paragraph below as the best solution for short-range communication of very high-speed signals while maintaining low power consumption. The III-V VCSEL is recognized as the most suitable and ideal device for short-range optical communication as well as a variety of other applications, see for example: "VCSEL arrays for high speed optical links", by Gulden, K. H.; Brunner, M.; Eitel, S.; Gauggel, H. P.; Hovel, R.; Hunziker, S.; Moser, M., Gallium Arsenide Integrated Circuit (GaAs IC) Symposium, 2001. 23rd Annual Technical Digest, 21-24 Oct. 2001 Page(s): 53-56; "Smart integration and packaging of 2D VCSEL's for high-speed parallel links" by Kosaka, H.; IEEE Journal of Selected Topics in Quantum Electronics, Volume 5, Issue 2, March-April 1999 Page(s): 184-192, "780 nm VCSELs for home networks and printers" by Nakayama, H.; Nakamura, T.; Funada, M.; Ohashi, Y.; Kato, M.; Electronic Components and Technology Conference, 2004. Proceedings. 54th, Volume 2, 1-4 Jun. 2004 Page(s): 1371-1375 Vol.2

With the recent advances in the growth of III-V compounds on silicon substrate it is now possible to envision heterogeneous growth of VCSEL devices and photo-detectors onto Si substrate containing VLSI circuits. See for example, T. Ashley, L. Buckle, S. Datta, M. T. Emeny, D. G Hayes, K. P. Hilton, R. Jefferies, T. Martin, T. J. Philips, D. J. Wallis, P. J. Wilding and R. Chau, "Heterogeneous InSb quantum well transistors on silicon for ultra-high speed, low power logic applications," Electronics Letters, Vol. 43, No. 14, July 2007. S. Datta, G. Dewey, J. M. Fastenau, M. K. Hudait, D. Loubychev, W. K. Liu, M. Radosavljevic, W. Rachmady and R. Chau, "Ultrahigh-Speed 0.5 V Supply Voltage I0.7Ga0.3As Quantum-Well Transistors on Silicon Substrate," IEEE Electron Device Letters, Vol. 28, No. 8, 2007, pp. 685-687. M. K. Hudait, G. Dewey, S. Datta, J. M. Fastenau, J. Kavalieros, W. K. Liu, D. Lubyshev, R. Pillarisetty, W. Rachmady, M. Radosavljevic, T. Rakshit and Robert Chau, "Heterogeneous Integration of Enhancement Mode In0.7Ga0.3As Quantum Well Transistor on Silicon Substrate using Thin (<2 um) Composite Buffer Architecture for High-Speed and Low-Voltage (0.5V) Logic Applications," International Electron Devices Meeting (IEDM) Technical Digest, 2007, pp. 625-628.

However, this vision is hampered by the fact that VCSEL epitaxial structures can be several microns (2 um-10 um) thick, and as such would be incompatible with the CMOS VLSI circuit planar topology and interconnects.

SUMMARY

In accordance with the invention, a semiconductor structure is provided comprising: a substrate; a seed layer over an upper surface of the substrate; a semiconductor layer disposed over an upper surface of the seed layer; a transistor device in the semiconductor layer; and, an opto-electric structure disposed on a bottom surface of the seed layer.

With such an arrangement because the opto-electronic device is formed on the bottom surface there is no disturbance to the front side of the wafer during the VLSI circuit fabrication, the planarity of the front surface is preserved. This enables the front side process to proceed according to the established multilayer metallization schemes well known to those skilled in the art of Si CMOS VLSI interconnect technology. If the optical element was grown on the top surface, the planarity of the top surface would be severely disturbed and this would result in significant cost and complexity for integrating the optical element with the standard CMOS VLSI circuits.

In one embodiment, the substrate has an aperture therein, such aperture extending from a bottom surface of the substrate and terminating on a bottom surface of the seed layer.

In one embodiment, the opto-electric structure comprises a III-V structure.

In one embodiment, the substrate is a group IV material.

In one embodiment the opto-electronic structure comprises a photon detecting structure or a photon emitting structure.

In one embodiment, the substrate is silicon.

In one embodiment, the transistor is disposed in an upper surface portion of a first region of the semiconductor layer and wherein the semiconductor layer has an aperture in a second, laterally spaced region of the semiconductor layer, such aperture in the semiconductor layer extending from the upper surface portion of the semiconductor layer and terminating on the seed layer over the opto-electronic structure.

In one embodiment, light passes through the aperture in the semiconductor layer.

In one embodiment, the structure includes electrical contacts to the transistor, such contacts being disposed over the upper surface portion of the semiconductor layer and an electrical contact to the electro-optical structure, such electrical contact to the electro-optical structure opto-electric electrical contact being disposed over the upper surface portion of the semiconductor layer.

In one embodiment, the seed layer is germanium.

In one embodiment, a semiconductor structure is provided having: a layer of material; a semiconductor layer disposed over the layer of material, the semiconductor layer having a transistor formed therein; and an electro-optical device deposed under the layer of material.

In one embodiment, the transistor faces an upper side of the structure and the electro-optical device faces a backside of the structure.

In one embodiment, the transistor has an active region facing a front side of the structure and wherein the electro-optical device has an active region facing a backside of the structure.

In one embodiment, the transistor faces an upper side of the structure and the electro-optical device faces a backside of the structure.

In one embodiment, the transistor has an active region facing a front side of the structure and wherein the electro-optical device has an active region facing a backside of the structure.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
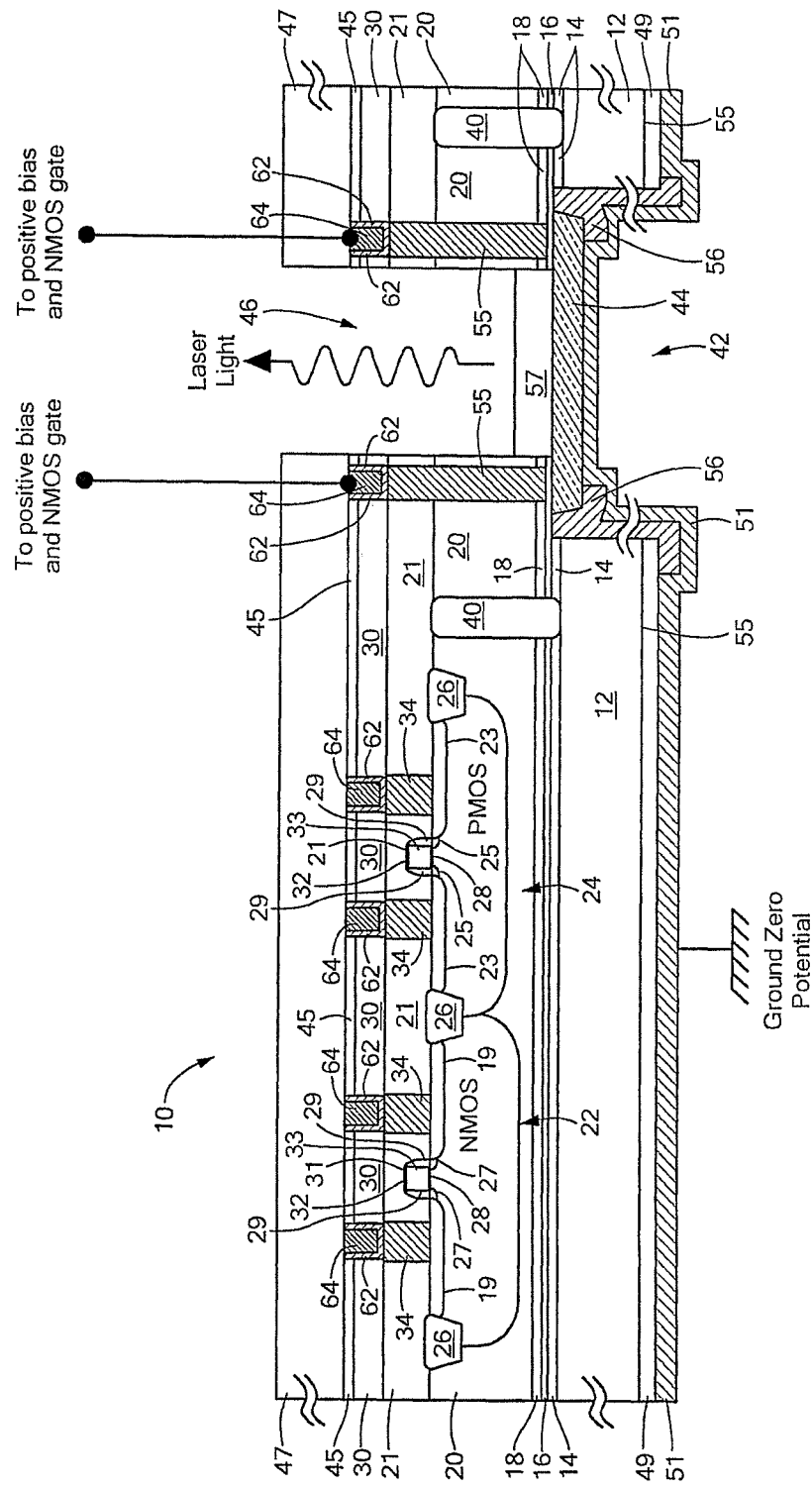
FIG. 1 is a cross sectional view showing a semiconductor structure having an electrical arrangement for driving the heterogeneously integrated III-V VCSEL with CMOS VLSI circuits in accordance with the invention.

Referring now to FIG. 1, a semiconductor structure 10 is shown having: a semiconductor, here bulk silicon, substrate 12; a first insulating layer 14, here silicon dioxide disposed on an upper surface of the substrate 10; a seed layer 16, here N+ germanium (Ge), for example, formed on an upper surface of the first insulating layer 14; a second insulating layer 18, here silicon dioxide, is disposed on an upper surface of the seed layer 16; and a semiconductor layer 20, here bulk silicon or epitaxially grown layer of N or P type conductivity, having, for example, a doping of $1\times10^{16}$ per $cm^3$ disposed over the second insulating layer 18, here for example all formed using silicon on lattice-engineered substrate (SOLES) described in: a paper entitled "Fabrication of silicon on lattice-engineered substrate (SOLES) as a platform for monolithic integration of CMOS and optoelectronic devices", by Dohrman et al., published in Materials Science and Engineering B 135 (2006) 235-237; U. S. Patent Application Publication No. US 2008/0149915 A1, published Jun. 26, 2008 and U. S. Patent Application No. 2008/0149915 A1, published Jun. 26, 2008; and a paper entitled "Direct Growth of III-V Devices on Silicon", by Herrick et al., published in Material Research Society Symposium Proceedings, Volume 1068, Materials Research Society (1068-C02-10).

A pair of CMOS transistors 22, 24 is formed in the semiconductor layer 20 using any conventional processing. Here, a P-well is used for an NMOS transistor 22 with N+ implants for NMOS source/drains regions 19 and N+ implants for PMOS source/drain regions 23. The PMOS transistor 24 has shallow (LLD) implant regions 25 and the NMOS transistor 22 has shallow (LLD) implant regions 27. The transistors 22, 24 are electrically isolated by shallow regions 26 of silicon dioxide. There is a thin gate oxide (silicon dioxide) layer 28 and a first level of dielectric 21 such as silicon dioxide, PSG or BPSG for device interconnects. There are polysilicon gates 33 for both NMOS and PMOS transistors 22, 24. There are silicide ohmic contacts 32 to the polysilicon gates 33 for both NMOS and PMOS transistors 22, 24. There are tungsten plugs 34 in ohmic contact with the NMOS source/drains regions 19 and the N+ implants PMOS source/drain regions 23.

There is an additional dielectric layer 30, such as SiO2, deposited to protect the CMOS transistors 22, 24 from the front side of the structure 10. The tungsten (W) plugs 34 serve as a first level metal interconnect to the silicide 32. There are sidewall spacers 29 (silicon dioxide and/or silicon nitride) for both the NMOS and PMOS transistors 22, 24.

There is a dielectric layer 45 on layer 30, and a thin layer 62 of PVD (Physical Vapor Depostion) or ALD (Atomic Layer Deposition) deposited TiN and/or TaN diffusion barrier layer 62 on the tungsten plugs 34. There are first level Cu metallization 64 on the tungsten plugs 34. There is a CMOS higher level metallization layer 47, as shown.

There is an insulating layer 49 of SiO2 on the bottom surface 53 of the substrate 12 and a Pt/TiW metallization layer 51 on the layer 49 and on an electro-optical structure 44 to provide an electrode for the structure 44. The metallization layer 51 is insulated from the substrate 12 by the dielectric layer 49 and a dielectric layer 56, such as SiO2, Si3N4, for example, as shown There are deep trench isolation regions 40 (SiO2, or poly silicon and SiO2) formed through the silicon layer 20, as shown.

The substrate 12 has an aperture 42 therein, such aperture 42 extending from a bottom surface 53 of the substrate 12, through the first insulating layer 14 and terminating on a bottom surface of the seed layer 16. The opto-electric structure 44 is disposed on the bottom surface of the seed layer 16. Here, the opto-electric structure 44 comprises a III-V structure. The opto-electric structure 44 may be a light emitting structure or a photon detecting structure. It is noted that the light emitting structure may be formed in one region of the structure 10 and the photon detecting structure may be formed in another in another region or the structure 10.

Figures 1A, 1B:
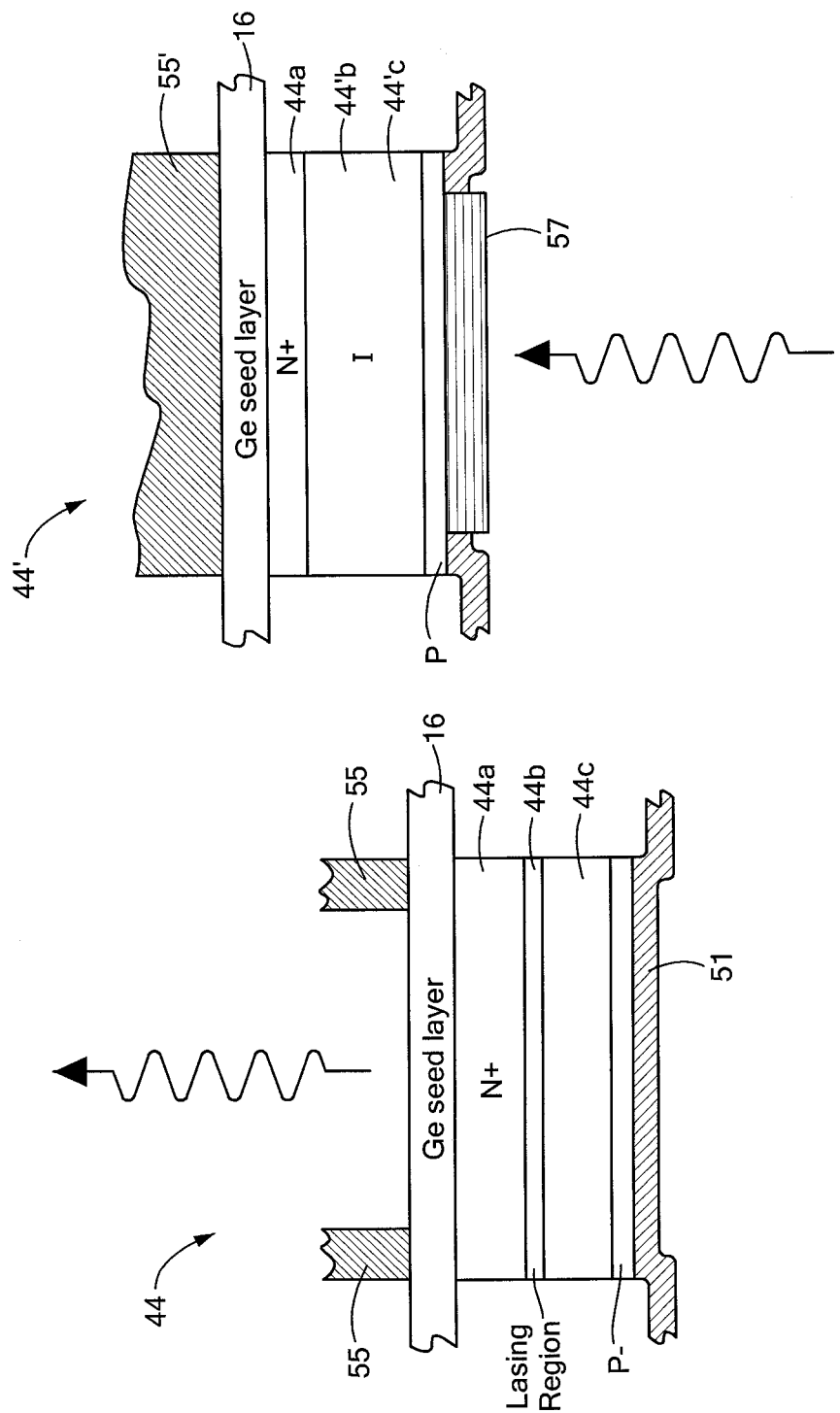
FIG. 1A is cross sectional view of a Vertical Cavity Surface Emitting Laser (VCSEL) device epitaxial layer grown on a seed layer of the structure of FIG. 1 facing the backside of the structure of FIG. 1.
FIG. 1B is cross sectional view of a PIN Photo-detector epitaxial layer grown on a seed layer of the structure of FIG. 1 facing the backside of the structure of FIG. 1.

More particularly, referring briefly to FIGS. 1A and 1B, FIG. 1A shows in a more detailed cross section of the island 44 formed as a light emitting structure island to include a lower N+ buffer layer and N+ AlGaAs distributed Brag Reflector (DBR) layer collectively shown as layer 44a is grown on the Ge seed layer 16, a middle AlGaAs spacer and InGaAs active (i.e., lasing region (~1-20% Indium with a wavelength of ~0.85-1.0 micrometers layer, collectively shown as 44b is grown on layer 44a, and an upper P+AlGaAs/GaAs DBR layer 44c is grown on layer 44b, the total thickness of the island 44 is here 2.0 to 10 microns. FIG. 1B shows in a more detailed cross section of the island 44 formed as a photon detecting structure PIN Photo-detector 44' having an N+ buffer layer 44'a, an intrinsic region layer 44'b for absorbing light (~20% Indium with a wavelength of ~1.0 um); and a P+ contact layer 44'c, the total thickness of the island 44' being in the range from 0.5 um to 10 micron.

It is noted that the transistors 22, 24 are disposed in an upper surface portion of a first region of the semiconductor layer 20 and the semiconductor layer 20 has an aperture 46, laterally spaced region of the upper surface portion of the semiconductor layer 20, for passing therethrough light, such aperture 46 in the semiconductor layer 20 extending from the upper surface portion of the semiconductor layer 20, through the second insulating layer 18 and terminating at the seed layer 16.

There is an annular electrode 55, here Ti/Al, making electrical contact to the opto-electric structure 44. It is noted the thin layer of PVD or ALD deposited TiN or TaN diffusion barrier 62 is on the Ti/Al electrodes 55. It is further noted that the Cu plating layer 64 is on the TiN or TaN diffusion barrier 62.

There is an optional anti-reflective layer 57 on the structure 44

Thus, the structure 10 includes a transistor device having active regions (e.g., the source and drain regions) therein facing a front side of the substrate and an opto-electric structure 44 having an active region (e.g., light receiving or generating surfaces 44a-44c) facing a backside of the structure 10). More particularly, the seed layer 16 has a semiconductor layer 20 disposed over the layer 16, the semiconductor layer 20 having a transistor 22, 24 formed therein; and an electro-optical device 44 is deposed under the seed layer 16.

Referring now to FIGS. 2A-2L, it is first noted that deep trench isolation regions 40 of SiO2 or poly Si and SiO2 are formed as shown prior to the CMOS gate formation. Then, after first forming the portion of the structure of FIG. 1 having the CMOS transistors 22, 24 and the tungsten (W) plugs 34, a thin (0.05 um to 0.50 um) protective dielectric layer 30 is deposited over the Si CMOS transistors 22, 24 and over any other Si circuits (not shown).

Figure 2A:
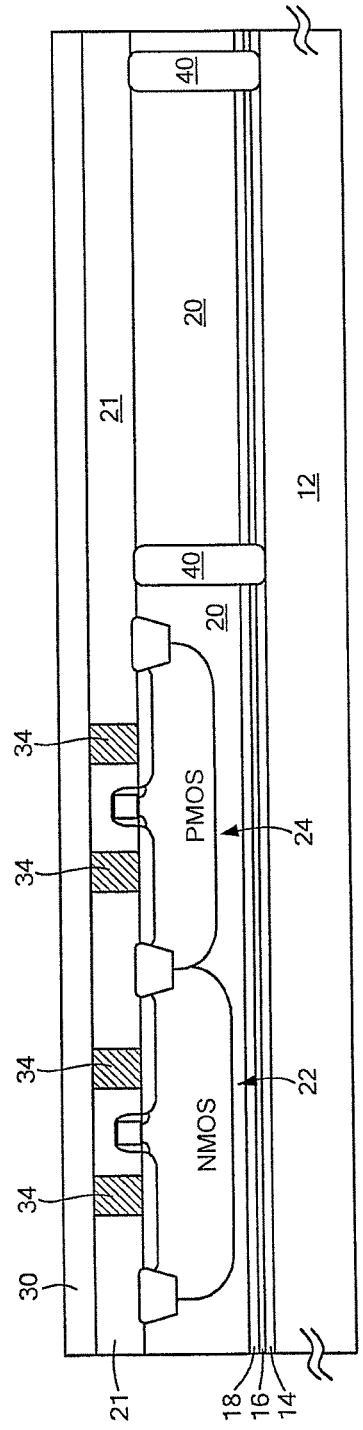
FIG. 2A is a cross sectional view after front side protective dielectric deposition.
Figure 2B:
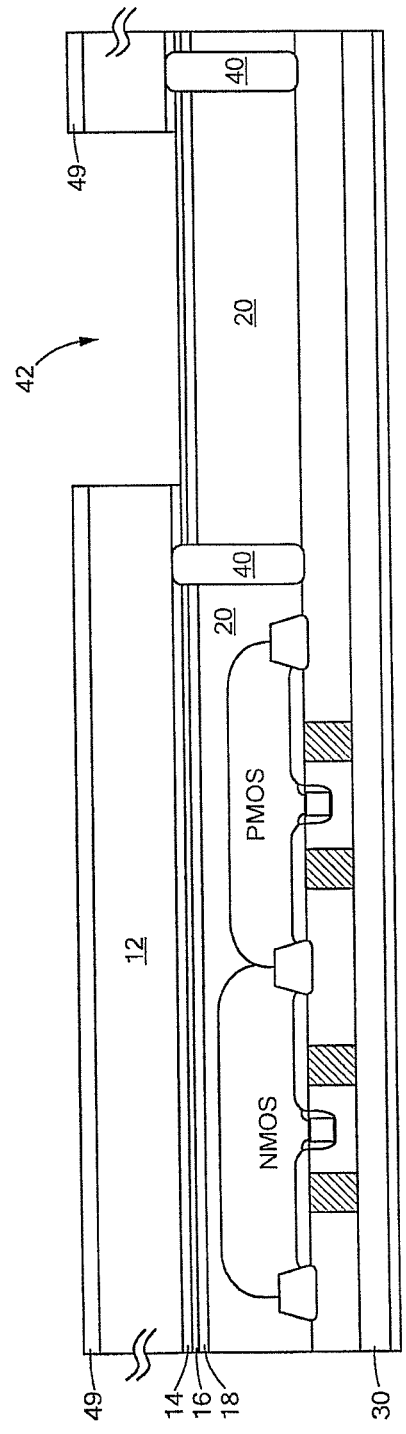
FIG. 2B is a cross sectional view after etching of Si wafer backside for growth of laser or detector III-V semiconductor materials on a seed layer.

Next, Si wafer structure 10 (FIG. 2A) is flipped over for "backside processing" as shown in FIG. 2B. The dielectric layer 49 (FIGS. 1 and 2B, such as SiO2, is deposited and patterned on the backside of Si substrate 12 using standard lithographic techniques for defining aperture 42 for III-V island 44 (FIG. 1) for electro-optic devices (photonics devices (e.g., the vertical cavity surface emitting laser (VCSEL), photodiode structures, etc.)). This is followed by etching the aperture 42 (FIGS. 1 and 2B) from backside through the silicon layer 12 and through the insulating layer 14 to reach and expose the Ge seed layer 16. A combination of dry and wet etching technique can be used for this process step. For example, the Si layer 12 can be dry etched and SiO2 layer 14 can be wet etched. Thus, the etching proceeds to remove portions of the SiO2 and Si isolated by the SiO2 down to the surface of the seed layer 16. Although the seed layer 16 is here the germanium (Ge), this invention applies equally to any seed layer, including the Si substrate itself. Optionally, the Si wafer, shown in FIG. 2B can be thinned down prior to the dielectric layer 49 deposition.

Figure 2C:
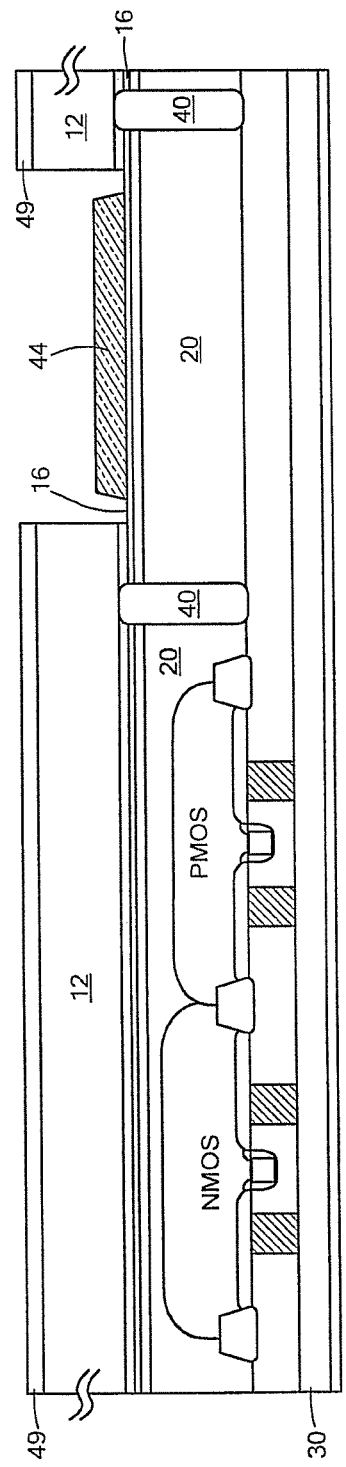
FIG. 2C is a cross sectional view after growth of Vertical Cavity Surface Emitting Laser (VCSEL) epitaxial layers on the seed layer facing the backside of Si.

Next, referring now to FIG. 2C, a photonics device island 44 growth of III-V is formed (here, for example, a here a VCSEL device) with subsequent removal/etching of any polycrystalline III-V growth on the dielectric layer 49. A more detailed cross section of the island 44 is shown in FIG. 1A to include the lower N+ buffer layer and N+ AlGaAs distributed Brag Reflector (DBR) layer collectively shown as layer 44a is grown on the Ge seed layer 16, the middle AlGaAs spacer and InGaAs active (i.e., lasing region (~1-20% Indium with a wavelength of ~0.85-0.0 micrometers) layer, collectively shown as 44b is grown on layer 44a, and the upper P+AlGaAs/GaAs DBR layer 44c is grown on layer 44b, the total thickness of the island 44 is here 2.0 to 10 microns. Various growth methods such as MBE, MOCVD, CVD, or modified versions of the above may be employed for the III-V island 44 growth and the present invention would equally apply to either or all such growth techniques. Electrical isolation between the III-V device and Si circuitry is achieved through deep trench isolation regions 40 known to those skilled in the art of Si VLSI circuit fabrication.

Figure 2D:
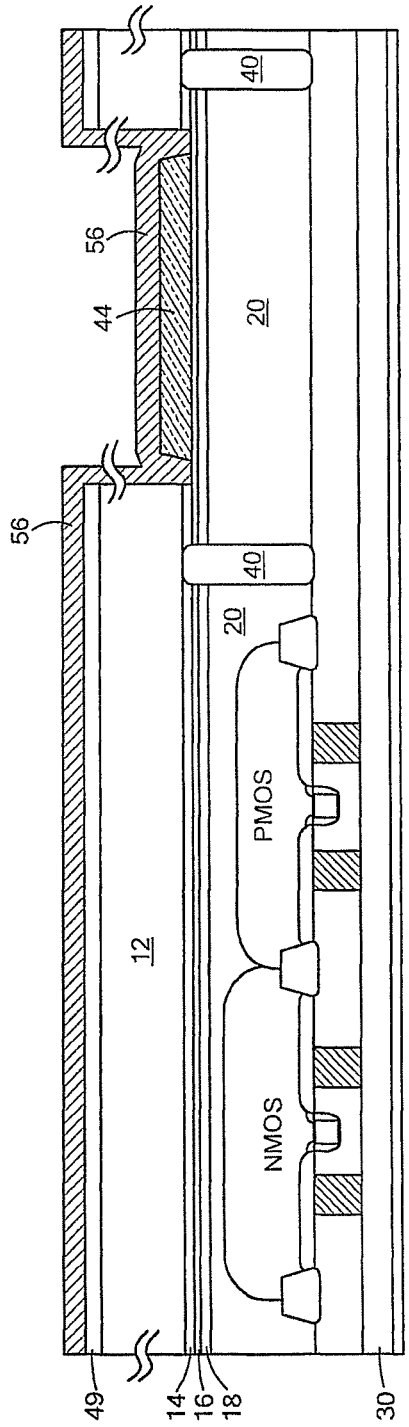
FIG. 2D is a cross sectional view after backside protective dielectric.

FIG. 2D shows the cross sectional view after the backside protective dielectric layer 56 deposition. This dielectric layer 56 can be SiO2, Si3N4, SiO$_x$N$_y$ or any suitable combination of them.

Figure 2E:
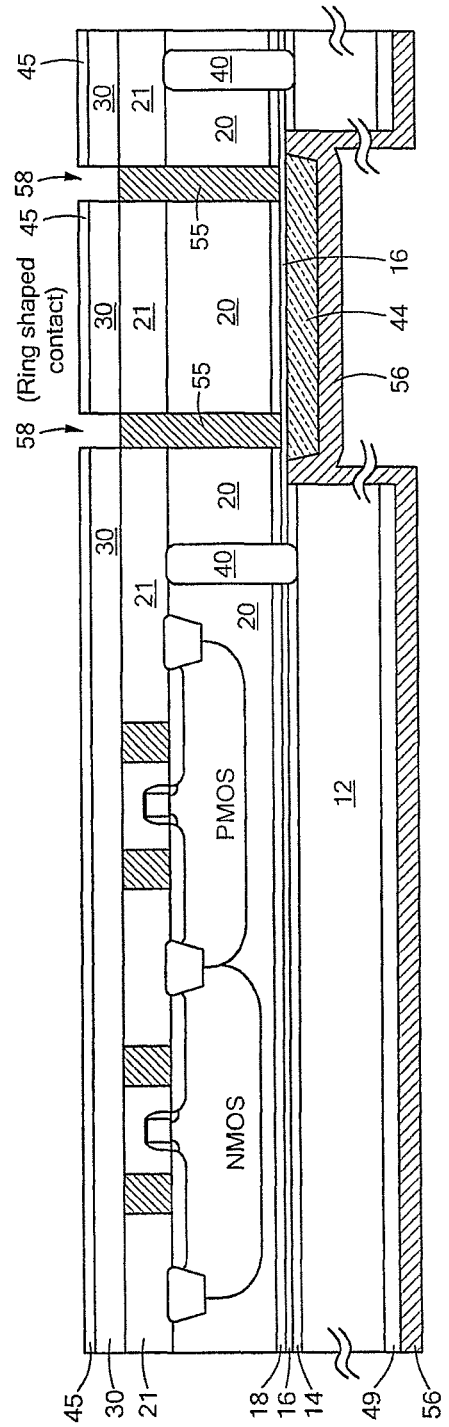
FIG. 2E is a cross sectional view after rings shaped contact opening and Ti/Al deposition and liftoff for formation of ohmic contact to Ge seed layers.

Next, Si wafer is flipped to its normal face, i.e., the front side as shown in FIG. 2E. This is followed by deposition of a thin layer 45 of SiN hard mask. The thickness of layer 45 can range from 0.03 um to 0.5 um. Using lithographic (photo resist mask, not shown) and etching techniques known to those skilled in the art of Si VLSI processing, a ring shaped contact hole or aperture 58 is opened all the way through the layers 45, 30, 21, 20, 18 to the Ge seed layer 16, and without removal of photo-resist mask (not shown), the Ti/Al layer 55 is deposited and lifted off to form a ring shaped ohmic contact hole to the Ge seed layer 16. The deposition method can be done through long throw distance sputtering, E-beam evaporation, or any other suitable method. Sintering of the Ti/Al ring shaped contact to the Ge seed layer 16 forms a low resistance ohmic contact to the VCSEL N+ region 44a, (FIG. 1A) through the Ge seed layer 16. The Ti/Al metal layer 55 thickness is chosen such as to have it line up horizontally with (i.e., be at the same height as, layer 21 (FIG. 1). The sintering temperature is preferably at 400 C or lower.

Figure 2F:
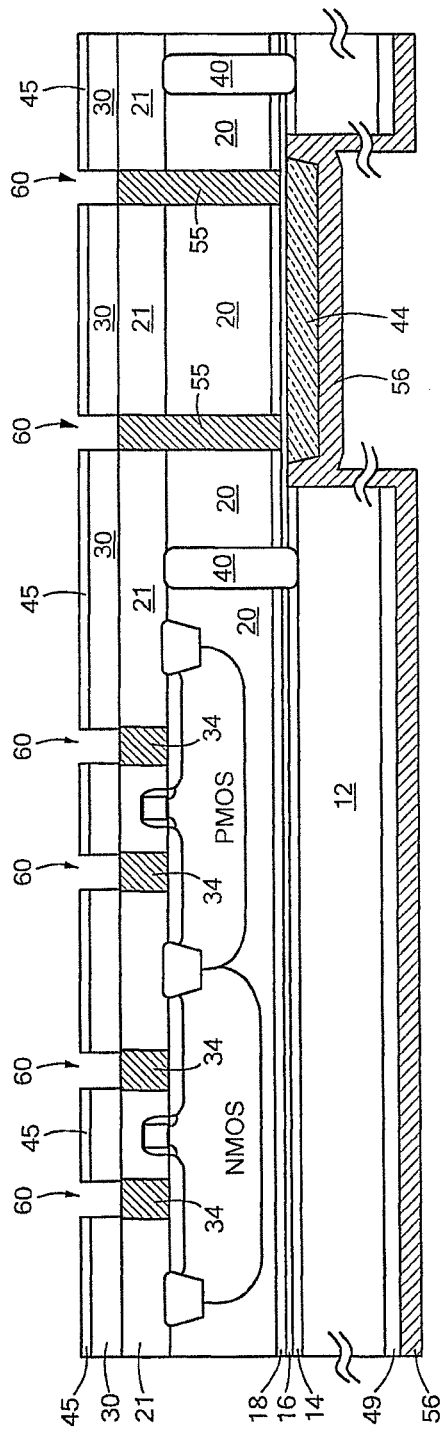
FIG. 2F is a cross sectional view after opening of contact holes to W plugs for the NMOS and PMOS.

FIG. 2F shows the cross sectional view after opening in layers 45 and 30 for contact holes 60 to W plugs 34 (FIG. 1) for Si NMOS and Si PMOS transistors 22, 24 and the contact holes to the annular Ti/Al metal electrode 55.

Figure 2G:
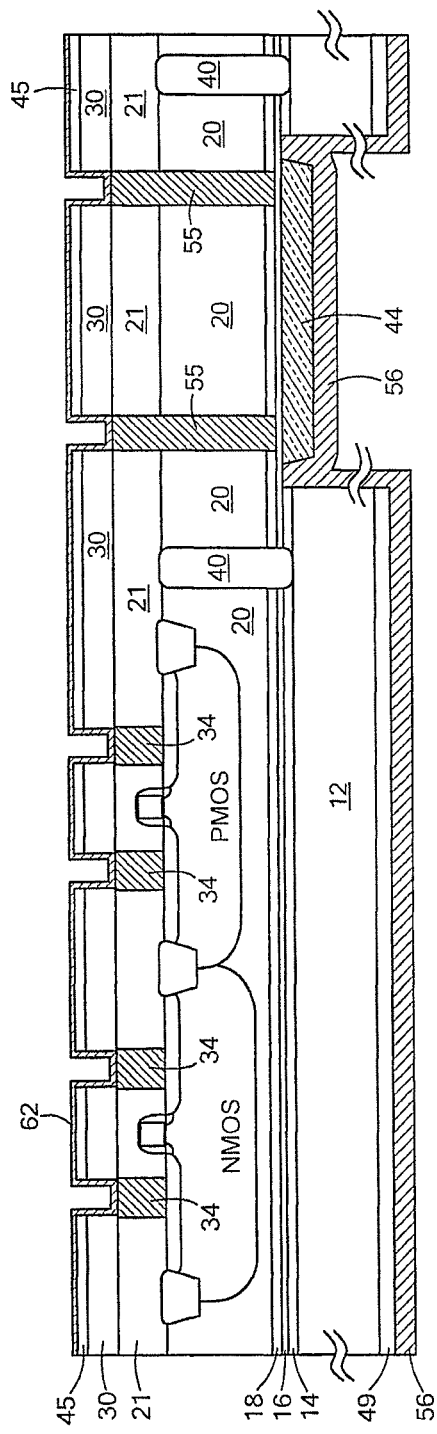
FIG. 2G is a cross sectional view after TiN or TaN diffusion barrier deposition.

FIG. 2G shows the cross sectional view after deposition of a diffusion barrier layer 62 such as TiN, TaN, TaN/Ta. These diffusion barrier metal nitrides and combinations of metal nitrides and metals are known to those skilled in the art of Si VLSI fabrication. The deposition can be made through a variety of methods such as "Physical Vapor Deposition (PVD)" or "Atomic Layer Deposition (ALD)".

Figure 2H:
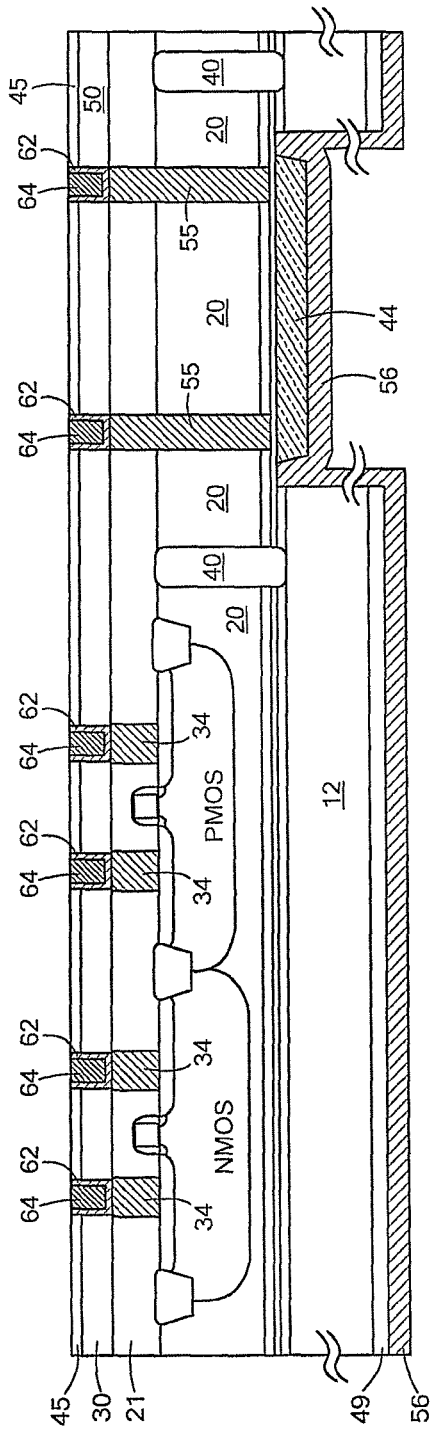
FIG. 2H is a cross sectional view after Cu plating and chemo-mechanical polish when the wafer is now ready for higher level of CMOS VLSI metallization.
Figure 2I:
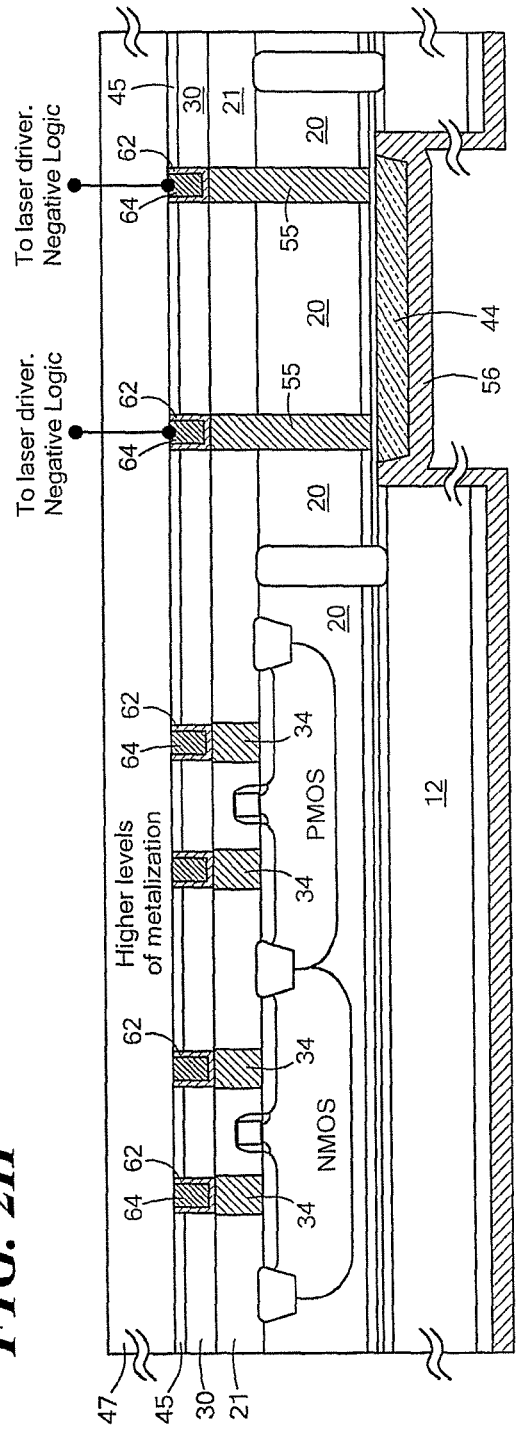
FIG. 2I is a cross sectional view after completion of front side processing.

FIG. 2H shows the cross sectional view after copper (Cu) seed layer 64 deposition, copper electroplating, and copper chemo-mechanical polishing and planarization These steps, shown in FIG. 2H (layer 64) are known to those skilled in the art of Si VLSI processing. At this point, the wafer is identical to a standard Si CMOS VLSI wafer after the first copper (Cu) interconnect. All subsequent metal interconnect steps (from second level Cu based interconnect to the tenth level of Cu based interconnect) can be carried out using standard processing methods employed in Si VLSI circuits known to those skilled in the art. These higher level of interconnects are pictorially shown as layer 47 in FIG. 2I. Also shown in FIG. 2I, it is noted that the ring shaped ohmic contact 55 to the N+ side of the VCSEL is connected to the CMOS circuitry and a negative logic (Logic Zero=A negative voltage such as −1.5 to −3 V, Logic One=Zero Volts) is used to drive the VCSEL.

Figure 2J:
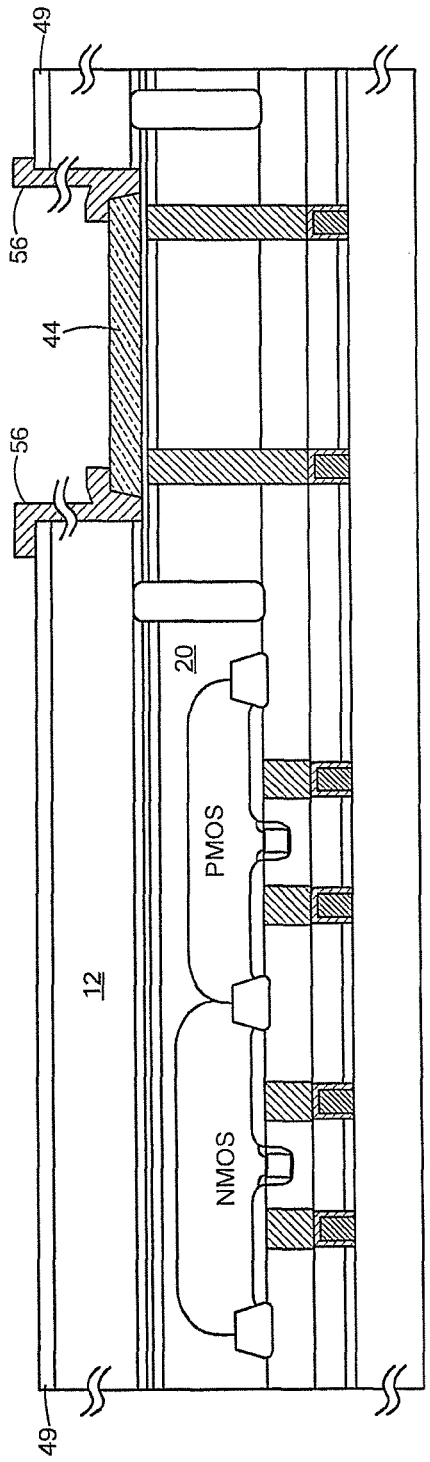
FIG. 2J is a cross sectional view after etching of backside protective dielectric to the VCSEL P+region.

Next Si wafer is flipped to its backside as shown in FIG. 2J and the protective dielectric layer 56 on the backside layer is etched away using dry etch, wet etch, or a combination of the two to expose the P+ side/region 44c of the VCSEL 44 (FIG. 1A).

Figure 2K:
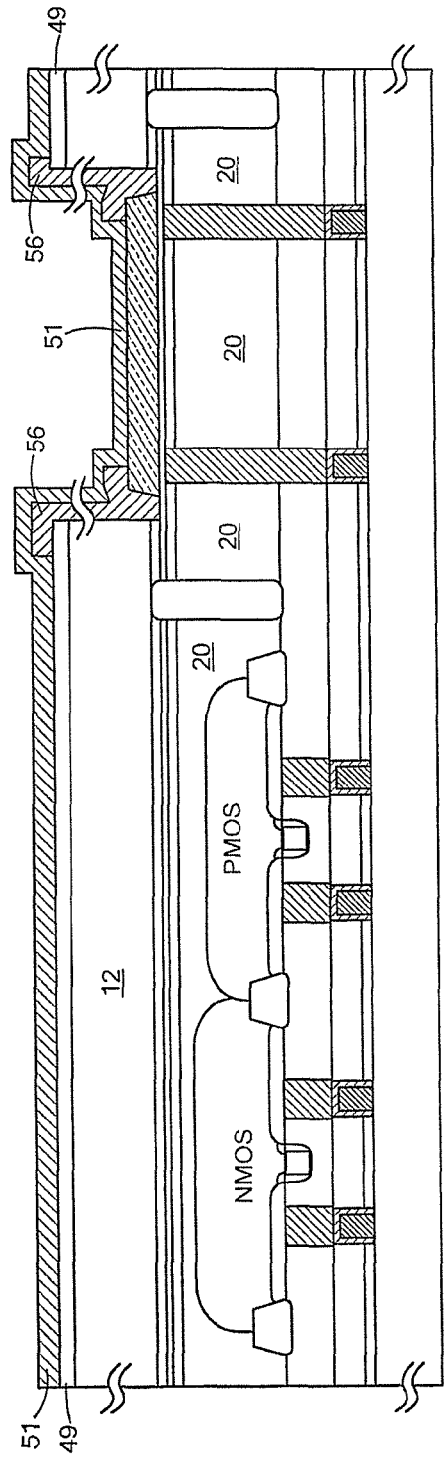
FIG. 2K is a cross sectional view after Pt/TiW ohmic contact metallization to the VCSEL P+region.

FIG. 2K shows the cross sectional view after the deposition of the Pt/TiW or just Pt metal layer 51 on the entire backside of the Si wafer followed by sintering at preferably 400 C or lower. The Pt or Pt/TiW layer 51 provides low resistance ohmic contact to the P+ side/region 44c (FIG. 1A) of the VCSEL 44.

Figure 2L:
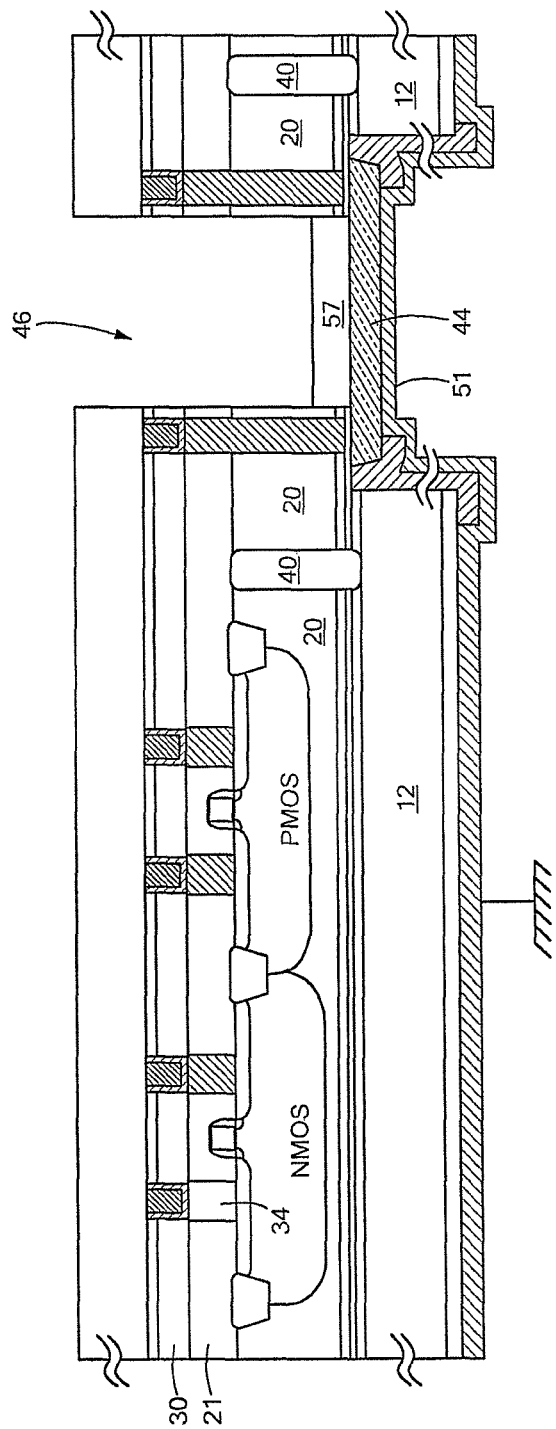
FIG. 2L cross sectional view after opening of optical window on top of VCSEL and optional anti-reflective coating.

FIG. 2L shows optional opening of the optical window layer 46 on the front side of the Si wafer and on top of the VCSEL N+ side/region. It is noted that the window 46 goes through the seed layer 16 on top of the device. The Ge seed layer 16 is removed, it being noted that layer 57 is shown touching layer 44, to avoid VCSEL light attenuation that has a free space wavelength of 0.85 to 1.0 um. The optional anti-reflective coating layer 57 is shown as well in FIG. 1.

With regard to forming a PIN Photo Detector Device, the only major difference between this device and VCSEL is the III-V epitaxial layer structure. The layer structure for PIN photodiode, also know as photo detector is shown in FIG. 1B. Following the growth of the photodiode epitaxial layer structure, the subsequent processing is identical to the ones described for VCSEL devices.

Figure 3:
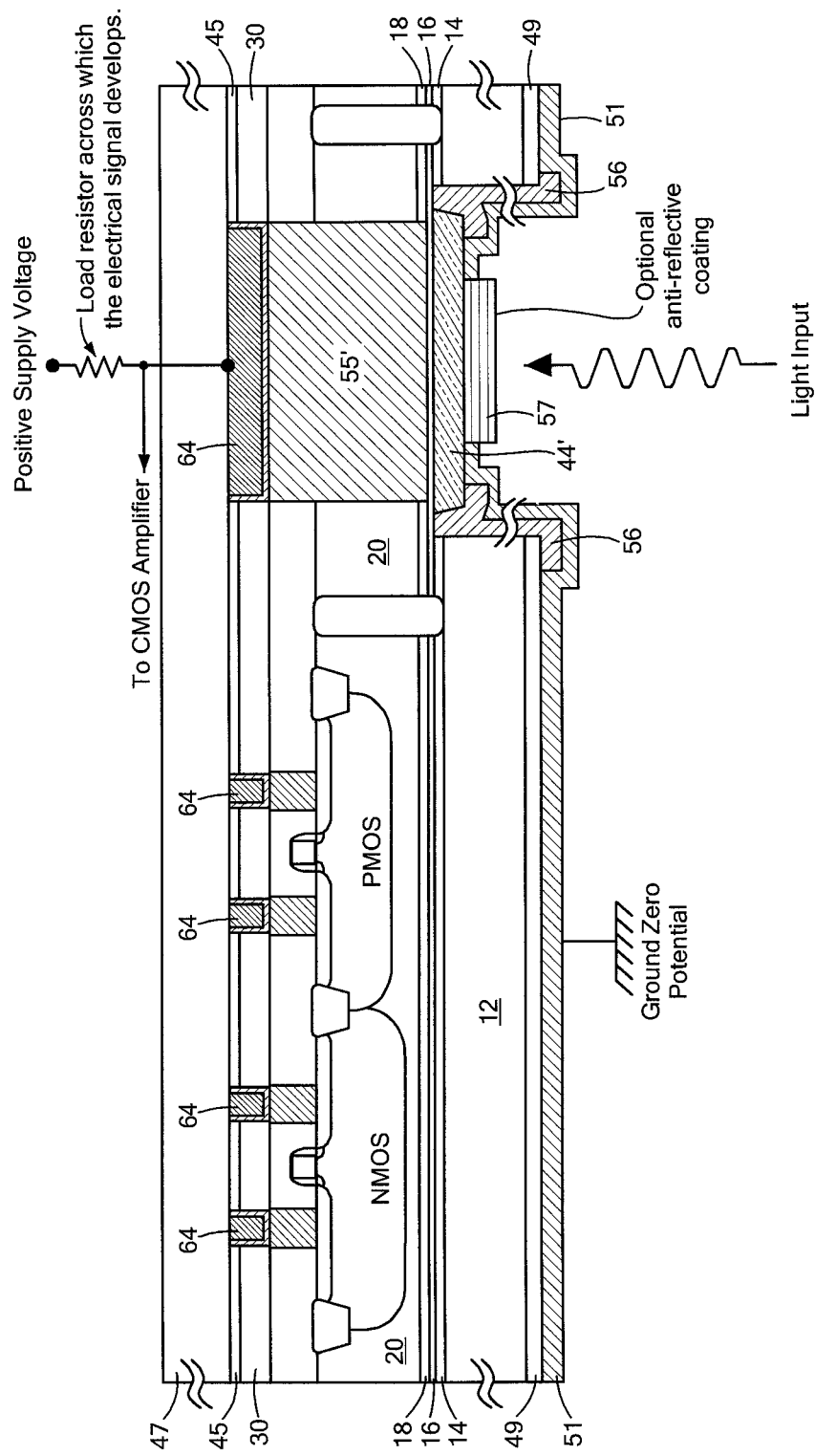
FIG. 3 shows a cross sectional view of the backside illuminated III-V photodiode integrated with CMOS circuitry for a wide range of imaging applications according to another embodiment of the invention.

Referring now to FIG. 3, shows a cross sectional view of the backside illuminated III-V photodiode integrated with CMOS circuitry for a wide range of imaging applications according to another embodiment of the invention. Here, the CMOS transistors face an upper side of the structure and the electro-optical device faces a backside of the structure. Thus, the CMOS transistors have active regions facing a front side of the structure and wherein the electro-optical device has an active region facing a backside of the structure.

Referring now to FIG. 3A, such FIG. 3A shows the cross sectional view after the processing of the structure shown in FIG. 2D. Thus, after the structure shown in FIG. 2D is formed, opening of contact holes 53 are formed (using a photoresist masking layer, not shown to reach the Ge seed layer 16 followed by deposition and liftoff of Ti/Al for contact 55' formation to the Ge seed layer 16. It is noted that the Ti/Al contact 55' thickness is chosen to line up to layer 30.

Next, openings 60 are in openings of contact holes through the hard mask 45 and SiO2 layer 30 to reach the contact W plugs 34, as shown in FIG. 3B.

Figure 3C:
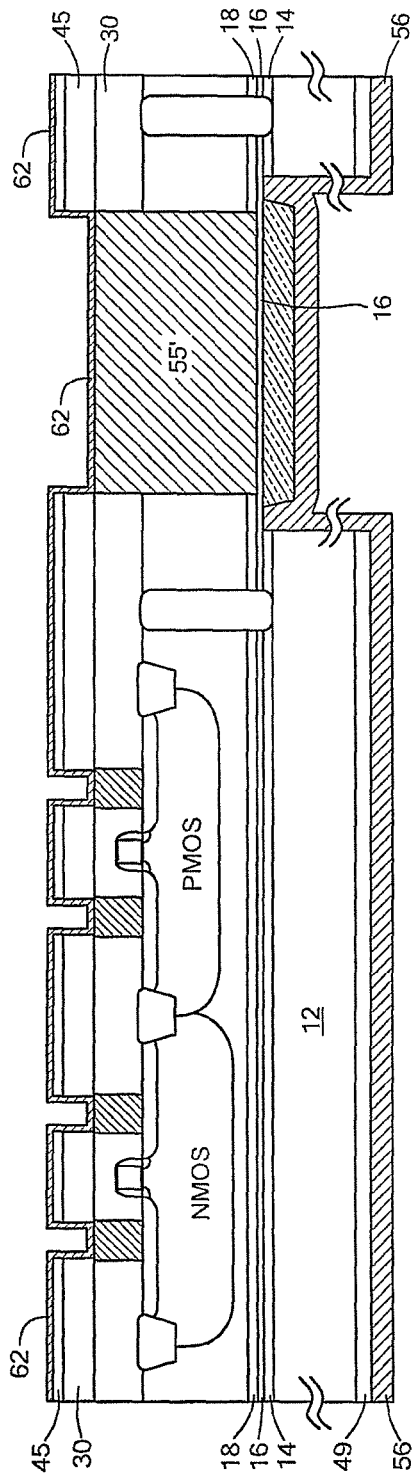
FIG. 3A shows the cross sectional view after the processing of the structure shown in FIG. 2D and FIGS. 3B-3G show cross sectional views after sunsequent processing thereof.

Next, a thin layer 62 of PVD or ALD deposited TiN and/or TaN diffusion barrier, as shown in FIG. 3C.

Figure 3D:
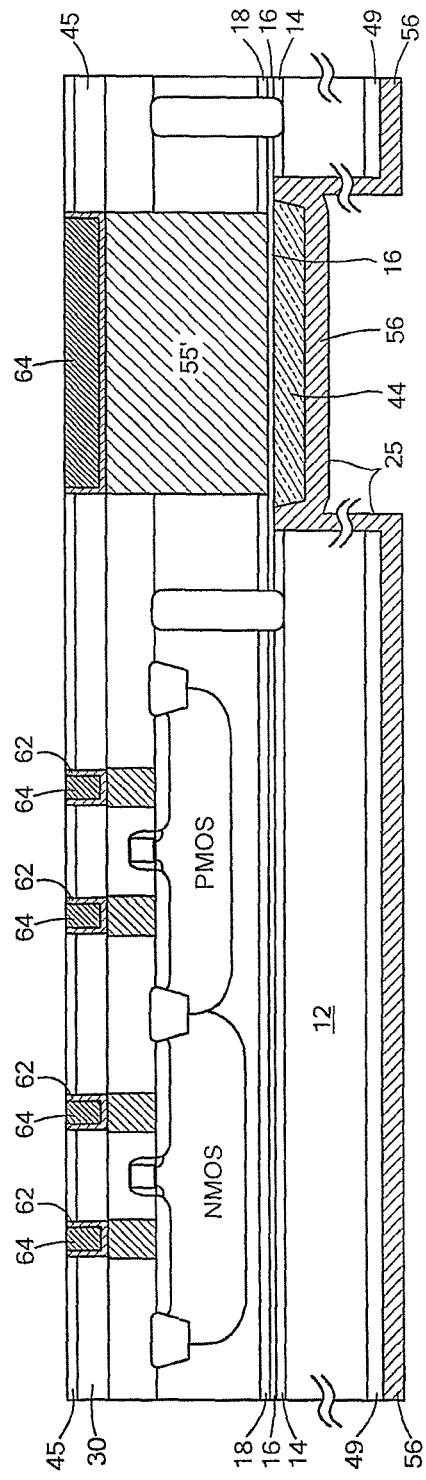

Next, a first level 64 of Cu metallization for VLSI CMOS circuits is formed by Cu plating and chemo-mechanical polishing (CMP), as shown in FIG. 3D.

A higher level of CMOS VLSI metallization 47 is formed to the completion of front side, as shown in FIG. 3E.

Next, the backside protective dielectric layer 56 is etched to the photo diode P+ region 44, as shown in FIG. 3F.

Figure 3G:
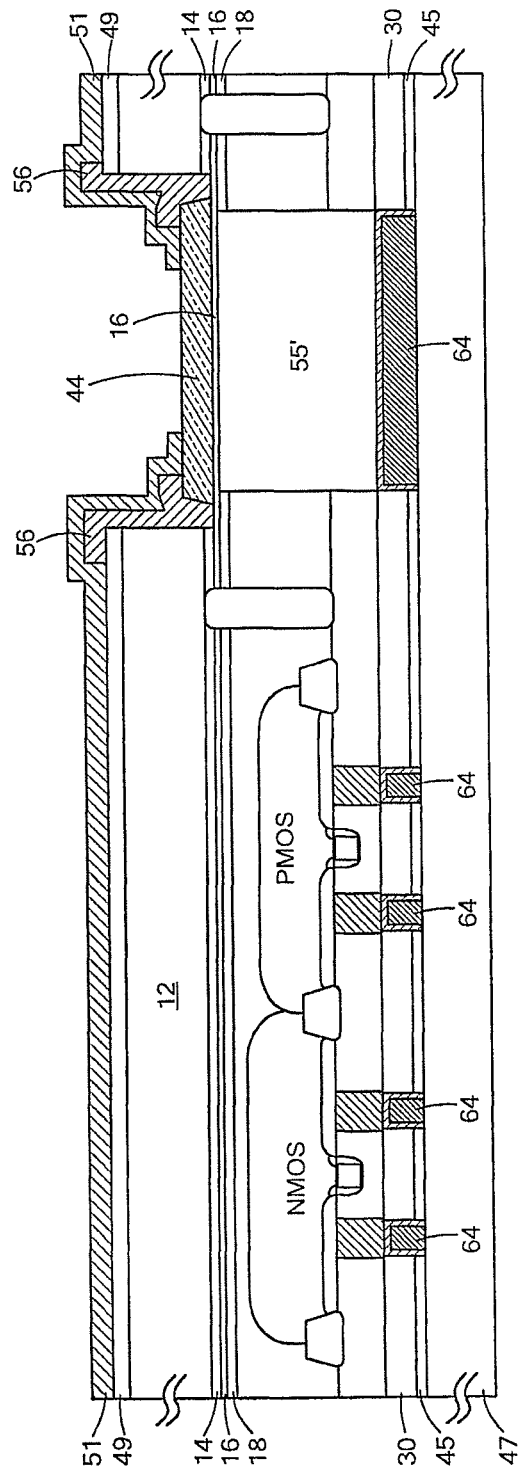

Next, Pt/TiW ohmic contact metallization layer 51 is formed to the VCSEL P+ region, as shown in FIG. 3G with final structure being shown in FIG. 3.

A number of embodiments of the invention have been described. Nevertheless, it will be understood that various modifications may be made without departing from the spirit and scope of the invention. For example, the copper layer 64 may be replaced with an aluminum layer, using sputtered aluminum deposition and subtractive patterning. Further, the application of this invention is not restricted to a specific method of growing III-V compounds on Si substrate. Thus, while Silicon on Lattice Engineered Substrate "SOLES", is used here for the purpose of illustrating the present invention, it must be emphasized that the present invention would apply to any existing or future viable methods of III-V growth on Si based substrate intended for heterogeneous integration with CMOS VLSI circuits. Accordingly, other embodiments are within the scope of the following claims.

What is claimed is:

1. A semiconductor structure, comprising:
a Column IV semiconductor substrate;
a Column IV semiconductor seed layer over an upper surface of the substrate;
a transistor device semiconductor layer disposed over an upper surface of the semiconductor seed layer, the transistor device semiconductor layer and the semiconductor seed layer being different materials;
a transistor device in the transistor device semiconductor layer;
an epitaxial opto-electric Column III-V semiconductor structure disposed on and in direct contact with a bottom surface of the semiconductor seed layer and laterally spaced from the transistor device; and
wherein the substrate has an aperture therein, such aperture extending from a bottom surface of the substrate and terminating on the bottom surface of the semiconductor seed layer in registration with the opto-electric structure.

2. The semiconductor structure recited in claim 1 wherein the substrate is silicon.

3. The semiconductor structure recited in claim 2 wherein the seed layer is germanium.

4. The semiconductor structure recited in claim 3 wherein the opto-electric structure comprises a photon detecting structure or a photon emitting structure.

5. The semiconductor structure recited in claim 4 wherein the substrate is silicon.

6. A semiconductor structure, comprising:
a silicon semiconductor substrate;
a germanium semiconductor seed layer over an upper surface of the substrate;
a transistor device semiconductor layer disposed over an upper surface of the semiconductor seed layer;
a transistor device in the transistor device semiconductor layer, the transistor device semiconductor layer and the semiconductor seed layer being different materials;
an epitaxial opto-electric Column III-V semiconductor structure disposed on and in direct contact with a bottom surface of the semiconductor seed layer; and
wherein the transistor is disposed in an upper surface portion of a first region of the transistor device semiconductor layer and wherein the transistor device semiconductor layer has an aperture in a second, laterally spaced region of the transistor device semiconductor layer, such aperture in the transistor device semiconductor layer extending from the upper surface portion of the transistor device semiconductor layer and terminating on the semiconductor seed layer over the opto-electric structure.

7. The semiconductor structure recited in claim 6 wherein light passes through the aperture in the transistor device semiconductor layer.

8. The semiconductor structure recited in claim 7 including electrical contacts to the transistor device, such contacts being disposed over the upper surface portion of the transistor device semiconductor layer and an opto-electric electrical contact to the electro-optical structure, such opto-electric electrical contact being disposed over the upper surface portion of the transistor device semiconductor layer.

* * * * *